United States Patent [19]

Herbert et al.

[11] Patent Number: 5,385,660
[45] Date of Patent: Jan. 31, 1995

[54] DENDRITIC GROWTH ASSISTED ELECTROFORM SEPARATION

[75] Inventors: William G. Herbert, Williamson; Loren E. Hendrix, Webster; Gary J. Maier, Webster; Ernest F. Matyi, Webster, all of N.Y.

[73] Assignee: Xerox Corporation, Stamford, Conn.

[21] Appl. No.: 169,281

[22] Filed: Dec. 20, 1993

[51] Int. Cl.⁶ .................................................. C25D 1/20
[52] U.S. Cl. .................................... 205/67; 205/73; 205/111
[58] Field of Search ............... 205/111, 67, 50, 70, 205/73, 69

[56] References Cited

U.S. PATENT DOCUMENTS

| | | | |
|---|---|---|---|
| 3,220,897 | 11/1965 | Conley et al. | 428/606 |
| 4,200,674 | 4/1980 | Inove | 427/290 |
| 4,534,831 | 8/1985 | Inoue | 205/67 |
| 4,597,836 | 7/1986 | Schaer et al. | 428/626 |
| 4,647,345 | 3/1987 | Polan | 205/50 |
| 4,663,256 | 5/1987 | Corrigan | 429/223 |
| 4,692,221 | 9/1987 | Parthasarathi | 205/77 |
| 4,766,813 | 8/1988 | Winter et al. | 102/307 |
| 4,902,386 | 2/1990 | Herbert et al. | 205/50 |
| 5,160,421 | 11/1992 | Melnyk et al. | 205/67 |

Primary Examiner—John F. Niebling
Assistant Examiner—Brendan Mee
Attorney, Agent, or Firm—Zosan S. Soong

[57] ABSTRACT

A method is disclosed for parting an electrodeposited article comprised of a first surface region and a second surface region from a mandrel, wherein the method comprises: (a) positioning the article and the mandrel in a metal deposition solution; (b) forming a plurality of metal dendrites on the second surface region wherein the first surface region is free of metal dendrites; and (c) separating the article and the mandrel.

18 Claims, No Drawings

DENDRITIC GROWTH ASSISTED ELECTROFORM SEPARATION

This invention relates generally to methods and apparatus for facilitating the parting of an electrodeposited article from a mandrel, and more particularly to those methods and apparatus that produce metal dendrites at the bottom of the article which may be gripped to facilitate parting. The electrodeposited article may be used for example as a substrate in the fabrication of photoreceptors.

Dendrites are metal depositions having a branching or tree-like shape which may resemble coral. Dendritic growth of an electrodeposit occurs as the limiting current density is approached. The limiting current density is defined as the current density where the cation concentration at the cathode (mandrel) is zero. Simply increasing the current density would cause the entire electrodeposited surface of the article to be dendritic which would be undesirable when one wants to produce a photoreceptor substrate. Thus, there is a need for methods and apparatus for the selective growth of dendrites on the article which would facilitate separation of the article and the mandrel. These methods and apparatus may be advantageous since they can be in addition to or a substitute for conventional separation techniques which rely on a difference in thermal coefficients of expansion between the article and the mandrel.

The following documents may be of interest: Winter et al., U.S. Pat. No. 4,766,813 (e.g., col. 2, lines 16–22); Parthasarathi, U.S. Pat. No. 4,692,221; Corrigan, U.S. Pat. No. 4,663,256; Polan, U.S. Pat. No. 4,647,345; Inoue, U.S. Pat. No. 4,534,831 (e.g., col. 2, lines 1–7 and col. 6, line 66 to col. 7, line 4); and Conley et al., U.S. Pat. No. 3,220,897.

SUMMARY OF THE INVENTION

It is an object to provide methods and apparatus for selective formation of metal dendrities on an article to provide a gripping surface in place of a relatively smooth surface to facilitate parting of the article from the mandrel.

It is a further object in embodiments to provide methods and apparatus for creating a current density higher at the end region of the mandrel/article to promote dendritic growth thereat while keeping the rest of the article free of metal dendrites.

These objects and others are accomplished in embodiments by providing a method for parting an electrodeposited article comprised of a first surface region and a second surface region from a mandrel, wherein the method comprises: (a) positioning the article and the mandrel in a metal deposition solution; (b) forming a plurality of metal dendrites on the second surface region, wherein the first surface region is free of metal dendrites; and (c) separating the article and the mandrel.

In embodiments, there is also provided a method for facilitating the parting of an electrodeposited article comprised of a first surface region and a second surface region from a mandrel, wherein the method comprises: (a) positioning the article and the mandrel in a metal deposition solution; (b) creating a current density higher at a portion of the second surface region than at the first surface region to form a plurality of metal dendrites on the second surface region, wherein the first surface region is free of metal dendrites; (c) gripping a portion of the second surface region while separating the article and the mandrel; and (d) discarding a portion of the second surface region.

DETAILED DESCRIPTION

The phrase "second surface region" refers to the surface area of the article which is to contain metal dendrites. In embodiments, the second surface region corresponds to the end region of the article, i.e., the portion formed over the end region of the mandrel. In embodiments, the dendrites may be formed on a portion of the second surface region, preferably ranging from about 1/5 the area of the second surface region to the entire area thereof, and more preferably from about ¼ to about ⅜ the area of the second surface region.

In embodiments, the phrase "end region" refers to the tapered portions of the mandrel and the article. Since the mandrel and the article formed thereon are typically integral one-piece components, it is sometimes difficult to precisely define where the mandrel/article sides end and where the end region begins, particularly if the mandrel possesses tapered sides. For convenience, the phrase "end portion" generally refers to that portion of the mandrel/article wherein the overlying electrodeposited material can be discarded without adversely affecting the use of the final article as a photoreceptor substrate. The phrase end portion can have other meanings, depending on the circumstances. For example, when no part of the article is discarded, the phrase end portion could identify the tapered portion of the mandrel/article. When the mandrel/article has tapered or entirely straight sides, the phrase end portion could specify in embodiments an arbitrarily defined length such as from about ⅛ to about ⅓ of the mandrel/article length as measured from the mandrel/article bottom. In embodiments, the end region comprises a length, as measured from the mandrel/article bottom, of from about 0.5 cm to about 50 cm, and especially from about 1 cm to about 15 cm. The phrase end region encompasses the bottom of the mandrel/article including the tip of the end region where the mandrel/article is tapered.

The phrase "first surface region" refers to the remainder of the surface area of the article which is not encompassed by the second surface region. In embodiments, the first surface region is that portion of the article which is employed as the substrate for a photoreceptor.

In the instant invention, the apparatus and/or metal deposition process parameters responsible for enabling the formation of the metal dendrites on the second surface region of the electrodeposited article wherein the first surface region is free of dendrites may be employed prior to, during, or subsequent to formation of the article on the mandrel. Preferably, to form the metal dendrites on the article, the article and the mandrel remain in the same electrodeposition solution and apparatus as that used in the formation of the article. In another embodiment, after formation of the article on the mandrel, the article and the mandrel are moved to another metal deposition solution and electrodeposition apparatus where formation of the metal dendrites occurs.

Formation of the article and the metal dendrites may be conducted by employing any suitable electrodeposition process and apparatus, and especially those directed to electroforming, including the electroforming processes and apparatus illustrated in U.S. Pat. Nos. 4,501,646; 3,876,510; and 3,844,906, the disclosures of which are totally incorporated by reference. Although preferred processes, materials, and apparatus are described in the context of electroforming, it is understood that the methods and apparatus disclosed herein are suitable in other metal deposition processes. For example, a plated cylindrically shaped mandrel having an ellipsoid shaped end may be suspended vertically in an electroplating tank. The electrically conductive mandrel plating material should be compatible with the metal plating solution. For example, the mandrel plating may be chromium. The top edge of the mandrel may be masked off with a suitable non-conductive material, such as wax to prevent deposition. The electroplating tank is filled with a plating solution and the temperature of the plating solution is maintained at the desired temperature. The electroplating tank can contain an annular shaped anode basket which surrounds the mandrel and which is filled with metal chips. The anode basket is disposed in axial alignment with the mandrel. The mandrel is connected to a rotatable drive shaft driven by a motor. The drive shaft and motor may be supported by suitable support members. Either the mandrel or the support for the electroplating tank may be vertically and horizontally movable to allow the mandrel to be moved into and out of the electroplating solution. Electroplating current can be supplied to the electroplating tank from a suitable DC source which provides a voltage preferably ranging from about 0.5 to about 24 volts. The positive end of the DC source can be connected to the anode basket and the negative end of the DC source connected to a brush and a brush/split ring arrangement on the drive shaft which supports and drives the mandrel. The electroplating current passes from the DC source to the anode basket, to the plating solution, the mandrel, the drive shaft, the split ring, the brush, and back to the DC source. In operation, the mandrel is lowered into the electroplating tank and continuously rotated about its vertical axis. As the mandrel rotates, metal is deposited on its outer surface.

Any suitable process and apparatus may be employed to form the metal dendrites on the second surface region of the article while keeping its first surface region free of dendrites. For example, dendrites may be formed solely on the second surface region by creating a current density higher at a portion of the second surface region than at the first surface region. Preferably, the current density is higher at from about 10 to 100% of the surface area of the second surface region, and more preferably from about 20 to about 60% of the surface area of the second surface region. The higher current density at the second surface region tends to increase the rate of metal deposition on surface protuberances (naturally occurring and/or purposefully induced) where metal is disproportionately added to the top of the protuberances which then grows, thereby eventually forming the dendrites. Since the current density is lower at the first surface region, dendrite formation is minimized there. To create a sufficient differential in current densities between the first and second surface regions to form the dendrites, any suitable methods and/or apparatus may be employed including one or more of the following: a mandrel having a tapered end region; one or more protuberances on the mandrel that purposely induce the formation of corresponding protuberances on the second surface region, which are sites for dendrite formation; raising the article in the metal deposition solution relative to the anode to expose a greater portion of the anode to the end region of the article; employing an anode having a shape which exposes a greater portion of the anode to the second surface region of the article; and disposing an electrically conductive strip beneath the bottom of the article, wherein the strip is in direct electrical contact with the anode.

In embodiments of the present invention, the mandrel possesses a tapered end region, particularly an ellipsoid shaped end, with the mandrel profile preferably like that illustrated in Herbert et al., U.S. Pat. No. 4,902,386, the disclosure of which is totally incorporated by reference. The tip of a tapered end region, especially an ellipsoid shaped end, because of its shape is at a higher current density than the rest of the mandrel surface. In embodiments of the present invention, the mandrel is of any effective design and is partially solid, preferably solid along about $\frac{1}{4}$ to about $\frac{3}{4}$ its length, and more preferably entirely solid. The mandrel may have partially closed ends, one of which is preferably closed. In embodiments, the mandrel is cylinder, optionally with tapered sides. Although the mandrel may have flat or nearly flat ends, which are closed or partially closed, it is preferred that at least one end has a tapered shape, particularly an ellipsoid shaped end. The mandrel may be of any suitable dimensions. For example, the mandrel may have a length ranging from about 5 cm to about 100 cms; and an outside diameter ranging from about 5 cm to about 30 cm. Where the mandrel has a tapered portion, the tapered portion has an effective taper, and preferably a taper of about 0.1 mm to about 1 mm per mm of tapered portion length. The mandrel may be fabricated from any suitable material, preferably a metal such as aluminum, nickel, steel, iron, copper, and the like.

An optional hole or slight depression at the end of the mandrel is desirable to function as a bleeding hole to facilitate more rapid removal of the electroformed article from the mandrel. The bleed hole prevents the deposition of metal at the apex of the tapered end of the mandrel during the electroforming process so that ambient air may enter the space between the mandrel and the electroformed article during removal of the article subsequent to electroforming. The bleed hole should have sufficient depth and circumference to prevent hole blocking deposition of metal during electroforming. For small diameter mandrel having an outside diameter between about 1/16 inch (0.2 mm) and about 2.5 inches (63.5 mm) a typical dimension for bleed hole depth ranges from about 3 mm to about 14 mm and a typical dimension for circumference ranges from about 5 mm and about 15 mm. Other mandrel diameters such as those greater than about 63.5 mm may also utilize suitable bleed holes having dimensions within and outside these depth and circumference ranges.

The mandrel may be optionally plated with a protective coating. The plated coating is generally continuous except for areas that are masked or to be masked and may be of any suitable material. Typical plated protective coatings for mandrels include chromium, nickel, alloys of nickel, iron, and the like. The plated metal should preferably be harder than the metal used to form the electroform and is of an effective thickness of for example at least 0.006 mm in thickness, and preferably from about 0.008 to about 0.05 mm in thickness. The outer surface of the plated mandrel preferably is passive, i.e., adhesive, relative to the metal that is electrodeposited to prevent adhesion during electroforming. Other factors that may be considered when selecting the metal for plating include cost, nucleation, adhesion, oxide formation and the like. Chromium plating is a preferred material for the outer mandrel surface because it has a naturally occurring oxide and surface resistive to the formation of a strongly adhering bond with the electro-deposited metal such as nickel. However, other suitable metal surfaces could be used for the mandrels. The mandrel may be plated using any suitable electrodeposition process. Processes for plating a mandrel are known and described in the patent literature. For example, a process for applying multiple metal platings to an aluminum mandrel is described in U.S. Pat. Nos. 4,067,782, and 4,902,386, the disclosures of which are totally incorporated by reference.

In embodiments, the mandrel is provided with a plurality of protuberances at its end region which may function as current density enhancers to promote dendritic growth. The protuberations may be of any effective number, shape, pattern, and size. For example, they may range in number from 1 to about 100, and more preferably from about 5 to about 20. Preferably, the protuberations resemble circular or oval shaped bumps. The protuberations may be arranged in a orderly pattern or a random pattern. In a preferred embodiment, the mandrel is fabricated so that a plurality of protuberances are arranged around the edge of the air inlet hole at the bottom of the mandrel to promote the formation of dendrites around the air inlet hole. The protuberations preferably have a diameter ranging from about 0.5 to about 5 mm, and a height ranging for example from about 0.5 to about 4 mm.

Conventionally, during formation of the article, the bottom of the mandrel is at substantially the same level as the bottom of the anode, wherein the bottom of the resulting article also is at substantially the same level as the anode bottom. Thus, the entire height of the anode may face a corresponding portion of the mandrel/article. To promote dendritic growth in embodiments of the present invention, the article/mandrel in the metal deposition solution may be raised to expose the second surface region of the article to a greater portion of the anode. The article/mandrel may be raised in the metal deposition solution by an effective amount ranging for example from about 1 cm to about 10 cm, and preferably from about 2 cm to about 5 cm. Raising the article/mandrel increases the current density at the second surface region, which may be for example, the end region of the article since the portion of the anode no longer directly facing the article/mandrel will interact electrically with the end region of the article. In effect, the second surface region is exposed to more of the anode, which results in an increased current density at the second surface region. In embodiments, raising the article/mandrel preferably increases the amount of anode surface area exposed to the second surface region by from about 10 to about 80%, and more preferably from about 15 to about 30%. Any suitable apparatus may be employed to raise the mandrel/article including for example a pulley and a transporting arm.

In one embodiment, the article may be positioned in the metal deposition solution so that only the second surface region is immersed in the solution wherein dendrite growth occurs only on the second surface region and the first surface region is free of dendrites since no metal deposition solution contacts its surface. Accordingly, in one embodiment, the following procedure is employed: submerging the mandrel in the electrodeposition solution; depositing material on the mandrel to form the article; raising the mandrel so that only the part of the article which requires dendrites is submerged in the electrodeposition solution; growing dendrites on the article; and subsequently separating the article and the mandrel.

In certain conventional processes to form the article, the anode employed is straight sided wherein the anode does not extend beneath the mandrel/article. To promote dendritic growth on the second surface region which may be the end region of the mandrel/article in embodiments of the present invention, a different anode is used which extends a portion of the anode beneath the end region of the mandrel/article and across the width thereof. For example, the anode may have a substantially "L" shaped configuration wherein the horizontal portion of the anode is extended beneath the bottom of the mandrel/article and across the width of the mandrel or the article. The anode preferably extends beyond the width of the mandrel or the article by an effective amount which may range for example from about 2 cm to about 20 cm beyond the mandrel or the article. In embodiments, the anode may fail to extend beyond the mandrel or the article, and may extend across only the width of the mandrel or the article or only a portion thereof such as from about $\frac{1}{3}$ to about $\frac{3}{4}$ the mandrel or the article width. In effect, the second surface region is exposed to more of the anode, which results in an increased current density at the second surface region. In embodiments, employing a substantially "L" shaped anode preferably increases the amount of anode surface area exposed to the second surface region by from about 10 to about 80%, and more preferably from about 15 to about 30%.

In embodiments of the present invention, the bottom of the the metal deposition vessel contains a preferred current path by, for example, attaching an electrically conductive member to the bottom of the vessel wherein the member extends from the anode across the entire width of the mandrel or the article. The member is in direct electrical contact with the anode. The member preferably extends beyond the width of the mandrel or the article by an effective amount which may range for example from about 2 cm to about 20 cm beyond the mandrel or the article. In embodiments, the member may fail to extend beyond the mandrel or the article, and may extend across only the width of the mandrel or the article or only a portion thereof such as from about $\frac{1}{3}$ to about $\frac{3}{4}$ the mandrel or the article width. This approach of disposing an electrically conductive member beneath the mandrel promotes selective dendritic growth because the second surface region, which may be the end region of the article, is exposed to more of the anode (the member effectively becomes an extension of the anode), thereby increasing the current density at a portion of the second surface region. In embodiments, employing a conductive member which effectively extends the anode preferably increases the amount of anode surface area exposed to the second surface region by from about 10 to about 80%, and more preferably from about 15 to about 30%. The conductive member may be of any effective shape and size. For example, the member may be in the form of a rectangular or round bar, preferably solid. The member has the following preferred dimensions: a length ranging from about 5 cm to about 50 cm; a width ranging from about 2 cm to about 20 cm; and a thickness ranging from about 5 mm to about 10 cm. The member may be a metal, and especially titanium, platinum, palladium, or any alloy thereof.

In addition to the methods and apparatus disclosed herein which may be used to create the differential in current densities between the first and second surface regions, the present invention in embodiments may employ one or more of the following to increase the propensity for dendritic growth. First, the temperature of the metal deposition may be decreased by an effective amount to promote the formation of metal dendrites, a decrease preferably ranging from about 2° to about 20° C., and more preferably ranging from about 5° to about 10° C., as compared with the temperature of the metal deposition solution employed during the formation of the article, which may range for example from about 35° to about 70° C. Consequently, the solution temperature after the decrease in temperature to promote dendritic growth may range for example from about 15° to about 68° C., and preferably from about 30° to about 50° C.

Second, the total deposition metal concentration may be decreased by an effective amount to promote the formation of metal dendrites, a decrease preferably ranging from about 10 to about 30%, and more preferably ranging from about 15 to 20%, as compared with the total deposition metal concentration employed during the formation of the article, which may range for example from about 10 to about 16.0 oz/gal. Consequently, the total deposition metal concentration after the decrease in concentration may range for example from about 8 to about 15.0 oz/gal, and preferably from about 8 to about 10 oz/gal.

Third, the total deposition metal concentration may be increased by an effective amount to promote the formation of metal dendrites, an increase preferably ranging from about 10 to about 30%, and more preferably ranging from about 15 to 20%, as compared with the total deposition metal concentration employed during the formation of the article, which may range, for example, from about 10 to about 16 oz/gal. Consequently, the total deposition metal concentration after the increase in concentration may range, for example, from about 14 to about 24 oz/gal, and preferably from about 17 to about 20 oz/gal.

Fourth, the agitation of the metal deposition solution may be decreased by an effective amount to promote the formation of metal dendrites, a decrease preferably ranging from about 10 to about 30%, and more preferably ranging from about 15 to about 20%, as compared with the agitation employed during the formation of the article, which may range for example from about 3 to about 6 linear feet per second. Consequently, the agitation of the solution after the decrease may range for example from about 1 to about 5.5 linear feet per second, and preferably from about 2 to about 4 linear feet per second.

An effective portion of the mandrel and article are immersed in the metal deposition solution during formation of the dendrites, preferably ranging from the second surface region alone to both the second surface region and a portion of the first surface region. The portion of the first surface region immersed in the solution may range for example from about 1/5 its surface area to the entire first surface region.

The current densities at the first and second surface regions may be any value effective for the formation of dendrites only on the second surface region. In embodiments, the current density at the second surface region is higher than the first current density by a value ranging from about 50 to about 600 amperes per square foot ("ASF"), and preferably from about 75 to about 250 ASF. The current density at the second surface region may range for example from about 300 to about 850 ASF, especially from about 350 to about 600 ASF, and the current density at the first surface region may range for example from about 50 to about 600 ASF, especially from about 100 to about 450 ASF.

The resulting dendrites may be of any shape, size, and number effective to provide a gripping surface to facilitate parting of the article and the mandrel. The dendrites may resemble coral in embodiments. Dendrites in accordance with the present invention will preferably have a population of about $1/cm^2$ to about $10^2/cm^2$, an aspect ratio (i.e., length/average width) of at least about 2 to about 10, and especially about 4. In preferred embodiments, the dendrites may have a length ranging from about 0.5 to about 6 mm, and especially from about 1 to about 3 mm; the dendrite width may range for example from about 0.2 to about 5 mm, and especially from about 0.5 to about 2 mm. Preferably, the dendrites are formed at the tip of the mandrel in a population ranging for example from about 4 to about 20, and especially from about 8 to about 12 dendrites. The dendrites may be formed from the same or different metal as the article. The dendrites preferably are comprised of nickel, aluminum, copper, iron, stainless steel, or alloys thereof.

A preferred electroforming or plating solution for the formation of the article and the metal dendrites is as follows:

Total Deposition Metal (such as nickel, copper, cobalt, or brass): 8 to 10 oz/gal (the recited concentration for the Total Deposition Metal refers to the metal in solution);

Deposition Metal (M) Halide (X) as $MX_2.6H_2O$: 0.01578 to 0.1578 moles/liter, where M is a metal such as nickel, copper, cobalt, or brass, and X is a halogen such as fluorine, chlorine, iodine, and bromine; and Buffering Agent (such as $H_3BO_3$): 4.5 to 6.0 oz/gal.

Optionally, there is continuously charged to said solution about 1.0 to $2.0 \times 10^{-4}$ moles of a stress reducing agent per mole of deposition metal electrolytically deposited from the solution. The metal halide may be any suitable compound typically used in electroforming solutions preferably nickel chloride, nickel bromide, and nickel fluoride.

For continuous, stable operation with high throughput and high yield of acceptable electroformed articles, a nickel sulfamate solution is preferred and is maintained at an equilibrium composition within the electroforming zone. The preferred nickel sulfamate solution comprises for the formation of the article and the metal dendrites:

Total Nickel (the recited Total Nickel concentration refers to the nickel ions in solution): 8 to 10 or 17 to 20 oz/gal;

Chloride as $NiCl_2.6H_2O$: 0.5 to 5 oz/gal;

$H_3BO_3$: 5.0 to 5.4 oz/gal;

pH: 3.8 to 4.1; and

Surface Tension: 33 to 37 dynes/$cm^2$ (measured using a surface tensionometer).

Additionally, from about 1.3 to $1.6 \times 10^{-4}$ moles of a stress reducing agent per mole of nickel electrolytically deposited from said solution is continuously charged to said electroforming solution.

Suitable stress reduction agents are sodium sulfobenzimide (saccharin), 2-methylbenzenesulfonamide, benzene sulfomate, naphthalene trisulfomate, and mixtures thereof.

It has been found that the pH can be essentially maintained within the range set forth above by maintaining a steady state concentration of buffering agent in the solution, generally boric acid ($H_3BO_3$), within the range of 5.0 to 5.4 oz/gal.

Control of the surface tension of the electroforming solution may be necessary in order to substantially reduce surface flaws, especially pitting in the electroformed article. The surface tension of the solution preferably ranges from about 33 to about 37 dynes/$cm^2$ in order to assure a high rate of production with minimum rejects because of surface flaws. The surface tension of the solution can be maintained within this range by maintaining a steady state concentration of an anionic surfactant such as sodium lauryl sulfate, Duponol 80, a sodium alcohol sulfate, Petrowet R, a sodium hydrocarbon sulfonate (said latter two surfactants being available from E. I. du Pont de Nemours & Co., Inc.), and the like, ranging from 0 to 0.014 oz/gal within the solution, and preferably, by maintaining a steady state concentration of from 0 to 0.007 oz/gal of surfactant therein.

It is preferred to maintain the electroforming solution in a constant state of agitation thereby substantially precluding localized hot or cold spots, stratification and inhomogeneity in composition. Agitation may be obtained by continuous rotation of the mandrel and by impingement of the solution upon the mandrel and cell walls as the solution is circulated through the system. Generally, the solution flow rate across the mandrel surface can range from about 4 to 10 linear feet/second. For example, at a current density of about 300 amps/$ft^2$ with a desired solution temperature range within the cell of about 135° to 160° F., a flow rate of about 15 gal/min of solution may be sufficient to effect proper temperature control. The combined effect of mandrel rotation and solution impingement may assure uniformity of composition and temperature of the electroforming solution within the electroforming cell.

The time required to form the dendrites ranges for example from about 5 minutes to about 5 hours, and preferably from about 5 minutes to about 2 hours.

An effective parting gap is optionally produced along the entire length of the mandrel or portions thereof to facilitate parting of the mandrel and the electroform by reliance for example on any differences in their thermal coefficients of expansion. Preferably the parting gap ranges from about 0.1 mm to about 1 cm, and more preferably from about 0.1 mm to about 5 mm in width separating the electroform and the mandrel.

Any suitable method and apparatus may be employed to assist in the removal of the electroformed article from the mandrel. For example, a mechanical parabolic end parting fixture may be employed to grasp a portion of the second surface region. Portions of the first surface region may also be grasped during the parting of the mandrel and the article. The grasping jaws may have as few as three fingers or may completely contact the electroform circumference like a lathe collet. In embodiments, the parting may be accomplished manually with the operator gripping a portion of the second surface region of the article, and optionally a portion of the first surface region. In another approach, the electroform/mandrel composite structure is inserted into an induction coil and by energizing the coil the electroform is heated and consequently enlarges, thereby loosening it from the mandrel. In a different approach, vibrational energy, especially ultrasonic energy, is used to cause the electroform to separate from the mandrel. In one embodiment, an ultrasonic bath is used during or after the parting gap is established to assist in removal of the electroform. It is also possible to use a vibrator which contacts the electroform or the mandrel. In the removal methods described herein, axial force, rotational force, or a combined force may be applied to the mandrel and/or the electroformed article to facilitate separation.

After parting of the electroform from the mandrel, the second surface region, containing the plurality of metal dendrities, optionally may be discarded. Removal of the second surface region may be accomplished by any suitable method and apparatus including lasers and other cutting tools. In embodiments, a portion less than the entire second surface region, ranging for example in area from about ¼ to about ½ the second surface region, may be retained.

Other modifications of the present invention may occur to those skilled in the art based upon a reading of the present disclosure and these modifications are intended to be included within the scope of the present invention.

What is claimed is:

1. A method for parting an electrodeposited article comprised of a first surface region and a second surface region from a mandrel, wherein the method comprises:
    (a) positioning the article and the mandrel in a metal deposition solution;
    (b) forming a plurality of metal dendrites on the second surface region, wherein the first surface region is free of metal dendrites; and
    (c) gripping a portion of the second surface region, thereby contacting the metal dendrites, while separating the article and the mandrel.

2. A method for facilitating the parting of an electrodeposited article comprised of a first surface region and a second surface region from a mandrel, wherein the method comprises:
    (a) positioning the article and the mandrel in a metal deposition solution;
    (b) creating a current density higher at a portion of the second surface region than at the first surface region to form a plurality of metal dendrites on the second surface region, wherein the first surface region is free of metal dendrites;
    (c) gripping a portion of the second surface region, thereby contacting the metal dendrites, while separating the article and the mandrel; and
    (d) discarding a portion of the second surface region to remove the plurality of the metal dendrites.

3. The method of claim 2, wherein the current density at the portion of the second surface region is higher than the first surface region by a value ranging from about 50 to about 600 amperes per square foot.

4. The method of claim 2, wherein the current density at the portion of the second surface region ranges from about 300 to about 850 amperes per square foot and the current density at the first surface region ranges from about 50 to about 600 amperes per square foot.

5. The method of claim 2, wherein the step (b) is effected by providing the mandrel with a tapered end region.

6. The method of claim 5, wherein the mandrel comprises an air inlet hole at the tip of the tapered end region.

7. The method of claim 5, wherein the second surface region covers a portion of the tapered end region of the mandrel.

8. The method of claim 5, wherein the second surface region covers a substantial portion of the tapered end region of the mandrel.

9. The method of claim 5, wherein the mandrel comprises a plurality of protuberances in the tapered end region.

10. The method of claim 2, wherein the step (b) is effected by providing the mandrel with a tapered end region, an air inlet hole at the tip of the tapered end region, and a plurality of protuberances arranged around the edge of the air inlet hole.

11. The method of claim 2, wherein the article is spaced from an electrode in a first position during the formation of the article, and the step (b) is effected by moving the article to a second position to expose the second surface region to a greater portion of the electrode.

12. The method of claim 2, wherein the article is spaced from a first electrode having a first shape during the formation of the article, and the step (b) is effected by employing a second electrode having a second shape which exposes the second surface region to a greater portion of the second electrode.

13. The method of claim 2, wherein the article is spaced from an electrode during the formation of the dendrites, and the step (b) is effected by disposing an electrically conductive strip beneath the second surface region, wherein the strip is in direct electrical contact with the electrode.

14. The method of claim 2, wherein the temperature of the metal deposition solution employed during the formation of the article ranges from about 35° to about 70° C., and further comprising decreasing the temperature of the metal deposition solution by about 2° to about 20° C. to promote the formation of the metal dendrites.

15. The method of claim 2, wherein the total deposition metal concentration employed during the formation of the article ranges from about 10.0 to about 16.0 oz/gal, and further comprising decreasing the total deposition metal concentration by about 10 to about 30% to promote the formation of the metal dendrites.

16. The method of claim 2, wherein the total deposition metal concentration employed during the formation of the article ranges from about 10.0 to about 16.0 oz/gal, and further comprising increasing the total deposition metal concentration by about 10 to about 30% to promote the formation of the metal dendrites.

17. The method of claim 2, wherein the agitation of the metal deposition solution employed during the formation of the article ranges from about 3 to about 6 linear feet per second, and further comprising decreasing the agitation of the metal deposition solution by about 10 to about 30% to promote the formation of the metal dendrites.

18. The method of claim 2, wherein in the step (a) the portion of the article disposed in the metal deposition solution ranges from the second surface region to both the first surface region and the second surface region.

* * * * *